(12) United States Patent
Mirzaei et al.

(10) Patent No.: US 7,782,127 B2
(45) Date of Patent: Aug. 24, 2010

(54) MULTI-MODE RECONSTRUCTION FILTER

(75) Inventors: Ahmad Mirzaei, Costa Mesa, CA (US); Alireza Zolfaghari, Irvine, CA (US); Hooman Darabi, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 12/020,132

(22) Filed: Jan. 25, 2008

(65) Prior Publication Data

US 2009/0189687 A1 Jul. 30, 2009

(51) Int. Cl.
*H03B 1/00* (2006.01)
*H03K 5/00* (2006.01)
*H04B 1/10* (2006.01)

(52) U.S. Cl. .................. 327/558; 327/536; 455/118

(58) Field of Classification Search ......... 455/108–113, 455/118–119; 327/536–543, 558
See application file for complete search history.

(56) References Cited

U.S. PATENT DOCUMENTS

| | | | | |
|---|---|---|---|---|
| 4,360,781 A * | 11/1982 | Sochor | ........................... | 327/2 |
| 4,626,803 A * | 12/1986 | Holm | .......................... | 332/151 |
| 5,486,787 A * | 1/1996 | Maekawa et al. | ........... | 327/560 |
| 6,151,186 A * | 11/2000 | O'Farrell | .................. | 360/78.04 |
| 6,265,856 B1 * | 7/2001 | Cali' et al. | ................... | 323/273 |
| 6,278,391 B1 * | 8/2001 | Walker | ........................ | 341/118 |
| 6,509,727 B2 * | 1/2003 | Fahrenbruch | ................ | 323/316 |
| 6,828,851 B1 * | 12/2004 | Lee et al. | ..................... | 327/537 |
| 7,030,598 B1 * | 4/2006 | Dow | .......................... | 323/313 |
| 7,049,866 B2 * | 5/2006 | Wilson | ........................ | 327/157 |
| 7,092,676 B2 * | 8/2006 | Abdelgany et al. | ............ | 455/76 |
| 7,103,327 B2 * | 9/2006 | Pan | ............................. | 455/102 |
| 7,166,991 B2 * | 1/2007 | Eberlein | ..................... | 323/280 |
| 7,239,196 B2 * | 7/2007 | Hasegawa | .................... | 327/552 |
| 7,310,252 B2 * | 12/2007 | Yan | .............................. | 363/59 |
| 7,397,226 B1 * | 7/2008 | Mannama et al. | ........... | 323/273 |
| 7,424,064 B2 * | 9/2008 | Shakeshaft et al. | .......... | 375/295 |
| 7,440,732 B2 * | 10/2008 | Pan | .............................. | 455/91 |
| 7,459,964 B2 * | 12/2008 | Dosho et al. | ................ | 327/554 |
| 7,496,865 B2 * | 2/2009 | Chang et al. | ................... | 716/2 |
| 7,602,161 B2 * | 10/2009 | McLeod | ...................... | 323/273 |
| 2002/0130646 A1 * | 9/2002 | Zadeh et al. | ................ | 323/275 |
| 2003/0078028 A1 * | 4/2003 | Shimada et al. | ............. | 455/339 |
| 2003/0232605 A1 * | 12/2003 | Peng | .......................... | 455/109 |
| 2005/0068092 A1 * | 3/2005 | Sano | .......................... | 327/541 |
| 2005/0087839 A1 * | 4/2005 | Tam et al. | .................... | 257/532 |
| 2005/0090213 A1 * | 4/2005 | Heng et al. | ............... | 455/154.1 |
| 2005/0191974 A1 * | 9/2005 | Pan | ............................. | 455/109 |
| 2006/0098765 A1 * | 5/2006 | Thomas et al. | .............. | 375/346 |
| 2006/0292999 A1 * | 12/2006 | Sorrells et al. | ............. | 455/110 |

(Continued)

*Primary Examiner*—Lincoln Donovan
*Assistant Examiner*—Adam D Houston
(74) *Attorney, Agent, or Firm*—Brake Hughes Bellermann LLP

(57) ABSTRACT

A circuit (e.g., a reconstruction filtering circuit) may include a single operational amplifier (op-amp) that is arranged to receive a voltage input and that is arranged to have a biasing of constant $g_mR$, a first device capacitor that is operatively coupled to an output of the single op-amp, a first resistor that is operatively coupled to the first device capacitor, a second device capacitor that is operatively coupled to the first resistor, and a mirror device that is operatively coupled to the second device capacitor, where the mirror device is arranged to provide a feedback loop as a feedback input to the single op-amp and that is arranged to provide a current output.

20 Claims, 2 Drawing Sheets

U.S. PATENT DOCUMENTS

| | | | |
|---|---|---|---|
| 2007/0249388 A1* | 10/2007 | Sorrells et al. | 455/552.1 |
| 2008/0074207 A1* | 3/2008 | McCune et al. | 332/109 |
| 2008/0084720 A1* | 4/2008 | Thiele et al. | 363/60 |
| 2008/0139146 A1* | 6/2008 | Behzad | 455/127.2 |
| 2008/0174284 A1* | 7/2008 | Zhou et al. | 323/266 |
| 2008/0205541 A1* | 8/2008 | Rofougaran | 375/269 |
| 2008/0219378 A1* | 9/2008 | Aggarwal | 375/298 |
| 2008/0253477 A1* | 10/2008 | Dalipi | 375/297 |
| 2008/0309414 A1* | 12/2008 | Sai | 331/34 |
| 2009/0027115 A1* | 1/2009 | Mizumasa | 327/553 |
| 2009/0036069 A1* | 2/2009 | Seckin et al. | 455/118 |

\* cited by examiner

US 7,782,127 B2

MULTI-MODE RECONSTRUCTION FILTER

TECHNICAL FIELD

This description relates to a multi-mode reconstruction filter that may be used for multi-mode multi-band wireless transceivers.

BACKGROUND

Filter circuits have been developed for a variety of purposes. For example, a reconstruction filter may be used to construct a smooth signal from the output of a digital-to-analog converter (DAC) or other sampled data output device. Typically, in integrated circuits (ICs), a reconstruction filter may be constructed from multiple stages of filters with each stage including a operational amplifier (op-amp) and different kinds of resistors and capacitors in order to perform its function. Since each stage includes an op-amp, a typical reconstruction filter may consume a large amount of power. Also, the reconstruction filter may exhibit non-linear characteristics because of the voltage to current conversion that takes place in the filter. Finally, the reconstruction filter may exhibit high noise characteristics, which may require higher power to combat the effect of the high noise.

SUMMARY

The details of one or more implementations are set forth in the accompanying drawings and the description below. Other features will be apparent from the description and drawings, and from the claims.

DETAILED DESCRIPTION

Figure 1:
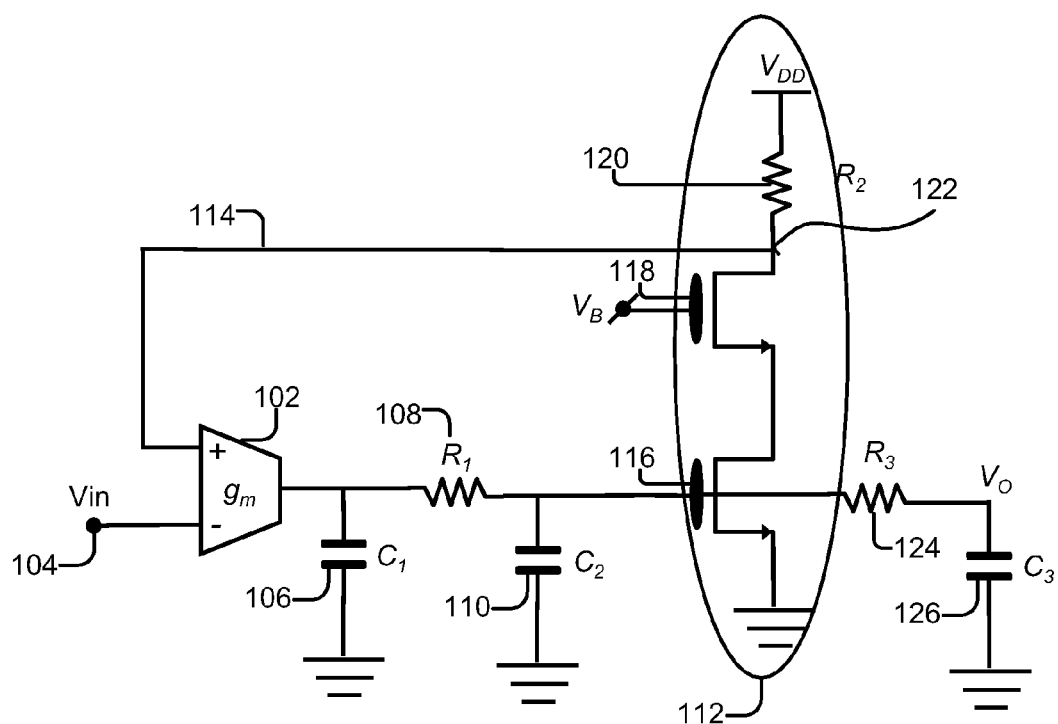
FIG. 1 is an exemplary circuit diagram of a multi-mode reconstruction filter.

Referring to FIG. 1, an exemplary schematic of a circuit 100 is illustrated. In one exemplary implementation, circuit 100 may be a multi-mode reconstruction filter. Circuit 100 may be a low pass filter. Circuit 100 may be multi-mode in that the circuit is reconfigurable to operate with multiple, different communication standards. For example, circuit 100 may be used in a transmitter application that is capable of using different standards for communications such as, for instance, Global System for Mobile Communications (GSM), Wideband Code Division Multiple Access (WCDMA), and Enhanced Data for GSM Evolution (EDGE). As explained in more detail below, circuit 100 is easily configurable to function properly for each of these different standards. In transmissions using WCDMA, for instance, circuit 100 may be configured to have a filter bandwidth of 2 MHz. In transmissions using EDGE, for instance, circuit 100 may be configured to have a filter bandwidth of 100 KHz.

Circuit 100 includes only a single transconductor 102 that is arranged and configured to receive a voltage input ($V_{in}$) 104. In one exemplary implementation, the single transconductor 102 is a single operation amplifier (op-amp) that is arranged and configured to have a $g_mR$-constant biasing. Because circuit 100 includes a single transconductor 102, the overall circuit power consumption is lower than a filter circuit having multiple stages of filters, where each of the stages includes one or more op-amps. The single transconductor 102 may have a very low current consumption.

A device capacitor 106 may be operatively coupled to the output of the transconductor 102, a resistor 108 may be operatively coupled to the device capacitor 106 and a device capacitor 110 may be operatively coupled to the resistor 108. In one exemplary implementation, the device capacitors 106 and 110 may be the same type of device capacitors. For example, the device capacitors 106 and 110 may both be high density metal oxide semiconductor (MOS) transistors. The device capacitors 106 and 110 may both be N-channel metal oxide semiconductor (NMOS) transistors.

Circuit 100 may include a mirror device 112 that is operatively coupled to the device capacitor 110. The mirror device 112 is arranged and configured to provide a feedback loop 114 as a feedback input to the transconductor 102. In this manner, noise from the mirror current from the mirror device 112 may be filtered by the same transfer function that is associated with the circuit 100. Thus, the mirror device 112 is included as a part of the filter and it is not outside of the filter. By having the mirror device 112 as part of the circuit 102, the DC current of the mirror device 112 may be lower when compared to the DC current that may be required to overcome the noise of the mirror current if the mirror device were to be outside of the filter.

The mirror device 112 may include a transistor 116, a transistor 118 and a resistor 120. The gate of the transistor 116 may be operatively coupled to the device capacitor 110. The drain of the transistor 116 may be operatively coupled to the source of the transistor 118. The resistor 120 may be operatively coupled to the drain of the transistor 118. The voltage at node 122 within the mirror device 112 may be equal to $V_{in}$ 104. The voltages may be equal and the voltage at node 122 may track $V_{in}$ 104 due to the feedback loop 114 and because the transconductor 102 exhibits a large gain and the loop gain may be quite large.

The resistor 120 may be an on-chip resistor, thus making it quad linear. The current of the resistor 120 may be proportional to $V_{in}$ divided by the value of the resistor 120, thus creating a linear current. In this manner, circuit 100 creates a very linear voltage to current conversion, which may be desirable.

Circuit 100 also may include a resistor 124 and a device capacitor 126. In one exemplary implementation, the device capacitor 126 may not be a physical capacitor within the circuit 100, but instead may represent the capacitance of the device that circuit 100 may be operatively connected to. For example, as described in more detail below with respect to FIG. 2, circuit 100 may be connected to one or more mixers. The device capacitor 126 may represent the input capacitance of the one or more mixers.

Alternatively, the device capacitor 126 may be a physical device capacitor. If the device capacitor 126 is a physical device, then it may be the same type of device as the device capacitors 106 and 110. For example, all three device capacitors 106, 110, and 126 may be NMOS transistors.

In an exemplary implementation where both the device capacitors 106 and 110 are the same type of device capacitor (e.g., both are NMOS transistors), then the device capacitors 106, 110 and 126 may have the same DC bias. In this example, there is no DC current passing through resistors 108 and 124 because of the structure of the circuit 100. Thus, the device capacitors 106, 110 and 126 may track each other, making the circuit 100 easily reconfigurable. The device capacitors 106, 110 and 126 may be robust with respect to process-voltage-temperature (PVT) variations.

Alternatively, the device capacitor 126 may include a combination of a physical device capacitor and an input capacitance of a device to which circuit 100 may be connected such as, for example, one or more mixers as described below with respect to FIG. 2. If the device capacitor 126 is a physical device, then it may be the same type of device as the device capacitors 106 and 110. For example, all three device capacitors 106, 110, and 126 may be NMOS transistors.

In one exemplary implementation, the resistors 108, 120 and 124 may be the same type of resistor. For example, the resistors 108, 120 and 124 may be on-chip quad linear resistors.

The circuit 100 may have a transfer function that is represented by the following equation:

$$H(s) = \frac{g_m RA}{RR_1R_3C_1C_2C_3s^3 + (RR_3C_2C_3 + RR_3C_1C_3 + RR_1C_1C_2 + RR_{13}C_1C_3)s^2 + R(C_1 + C_2 + C_3 + g_mR_3C_3A)s + g_mRA}$$

in which A is the gain of the mirror device 112. If the single transconductor 102 is a an op-amp that is $g_m$R-constant biasing, then the transfer function may be proportional to the time constant RC. By using the same type device capacitors 106, 110 and 126 and the same type of resistors 108, 120 and 124, then circuit 100 may be easily configurable to change the value of the frequency domain of the transfer function. For example, if the values of the device capacitors 106, 110 and 126 are kept constant and the values of the resistors 108, 120 and 124 are doubled, then in the frequency domain, the transfer function of the circuit 100 also will be scaled by half. In this manner, circuit 100 is configurable and can be easily modified to comply with the requirement of different communication standards such as, for example, WCDMA, GSM and EDGE.

The values of the resistors 108, 120 and 124 may be programmable and may be changed by a computer program product that is embodied on a computer-readable medium. The computer program product may send a signal to the resistors 108, 120 and 124 such that the values of these resistors may be changed.

Circuit 100 as illustrated in FIG. 1 may be a third order filter. Circuit 100 may be modified to be a higher order filter (e.g., fourth order, fifth order, etc.) by adding one or more stages of resistors and device capacitors. For example, circuit 100 may be made a fourth order filter by adding a resistor and a device capacitor. Circuit 100 may be made a fifth order filter by adding two resistors and two device capacitors in stages. Similarly, circuit 100 may be made a second order filter by removing a resistor and a device capacitor.

Thus, the input to circuit 100 is a voltage, $V_{in}$ 104, and the output of circuit 100 is a current. As discussed above, the conversion of the voltage input to the current is very linear because of the high loop-gain of the feedback configuration and arrangement of circuit 100.

Figure 2:
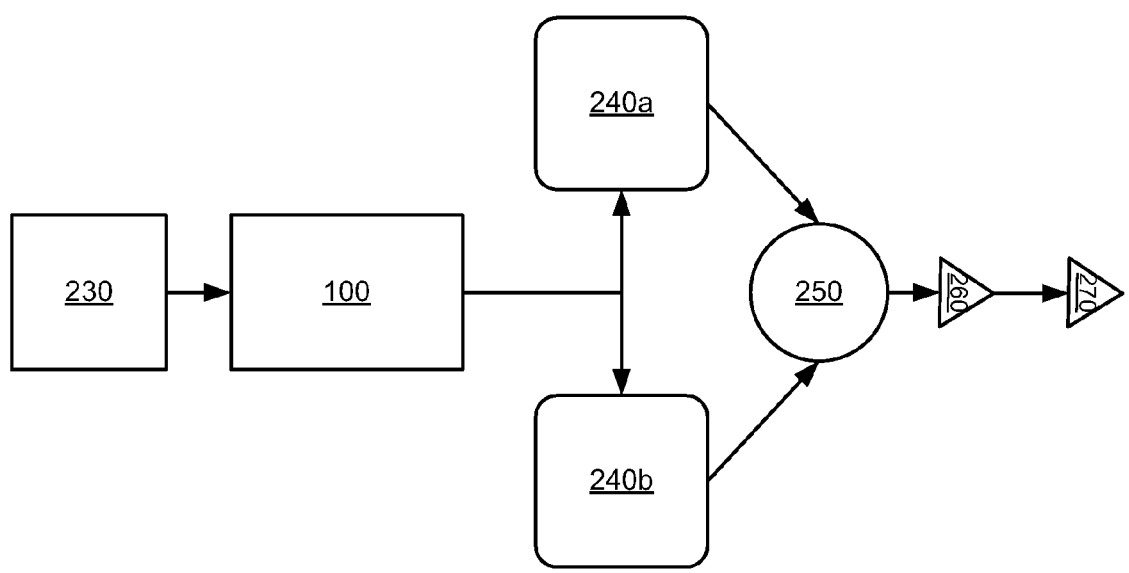
FIG. 2 is a block diagram of an exemplary system including the filter of FIG. 1.

Referring to FIG. 2, a system 200 is illustrated that includes circuit 100. In one exemplary implementation, system 200 may be a transmitter that is arranged and configured to be configurable to transmit signal using multiple, different communication standards such as, for instance, WCDMA, GSM and EDGE. The same transmitter system 200 may be configurable to use with different frequencies depending on the type of communication standard. For example, system 200 may be configured to operate at 1 GHz, 2 GHz, or other frequencies.

System 200 may include a digital-to-analog converter (DAC) 230, circuit 100, mixers 240*a* and 240*b*, a summation module 250, a power amplifier driver 260 and a power amplifier 270. The DAC 230 may be arranged and configured to receive a digital signal and to convert the digital signal to an analog signal. The digital data signal that is input into the DAC 230 may be in both I and Q quadrature inputs.

The analog signal output from the DAC 230 may be input into circuit 100. As discussed above, in one exemplary implementation, circuit 100 may be a configurable low pass filter that is arranged and configured to support multiple communications standards. Circuit 100 may be arranged and configured to receive the analog signal in the form of a voltage input, to filter the analog signal and to output a baseband signal in the form of a current output. As discussed above, circuit 100 may include a mirror device (e.g., mirror device 112 of FIG. 1), where the noise from the mirror current of the mirror device is filtered out by the components of circuit 100.

In one exemplary implementation, system 200 may include more than one DAC 230 and more than one circuit 100. For example, system 200 may include a DAC 230 and a circuit 100 that provides input to mixer 240*a* and a separate DAC 230 and separate circuit 100 that provides input to mixer 240*b*.

The baseband signal that is output from circuit 100 is input into one or more mixers 240*a* and 240*b*. The mixers 240*a* and 240*b* may be quadrature mixers that are arranged and configured to upconvert the baseband signals into radio frequency (RF) signals.

The RF signals outputted from the mixers 240*a* and 240*b* may be input to the summation module 250, where the RF signals from each of the mixers are summed together. The summation module 250 outputs a summed RF signal.

The RF signal output from the summation module 250 may be received by the power amplifier driver 260 and the power amplifier 270, where the RF signal is amplified for transmission.

In one exemplary implementation, the components of system 200 including, DAC 230, circuit 100, mixers 240*a* and 240*b*, summation module 250 and power amplifier driver 260 may be implemented on a same chip. The power amplifier 270 may be an off-chip component.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments.

What is claimed is:

1. A circuit comprising:
    a single operational amplifier (op-amp) that is arranged and configured to receive a voltage input and that is arranged to have a constant-$g_m$R biasing, wherein the constant-$g_m$R biasing enables a transfer function of the single op-amp to be proportional to a time constant;
    a first device capacitor that is operatively coupled to an output of the single op-amp;
    a first resistor that is operatively coupled to the first device capacitor;
    a second device capacitor that is operatively coupled to the first resistor; and
    a mirror device that is operatively coupled to the second device capacitor, wherein the mirror device is arranged and configured to provide a feedback loop as a feedback input to the single op-amp and that is arranged and configured to provide a current output.

2. The circuit of claim 1 wherein the first device capacitor and the second device capacitor comprise metal oxide semiconductor (MOS) type transistors.

3. The circuit of claim 1 wherein the mirror device comprises:
a first transistor having a gate operatively coupled to the second device capacitor;
a second transistor having a source operatively coupled to a drain of the first transistor and a drain that is arranged and configured to provide the feedback loop as the feedback input to the single op-amp; and
a second resistor operatively coupled to the drain of the second transistor.

4. The circuit of claim 3 wherein a voltage across the second resistor tracks the input voltage.

5. The circuit of claim 1 wherein the mirror device includes a second resistor and the circuit further comprising:
a third resistor operatively coupled to an output of the mirror device; and
a third device capacitor that is operatively coupled to the third resistor.

6. The circuit of claim 5 wherein the third device capacitor comprises an input capacitance of a modulator operatively coupled to the circuit.

7. The circuit of claim 5 wherein the first device capacitor, the second device capacitor and the third device capacitor have a same DC bias to track each other.

8. The circuit of claim 5 wherein the first resistor, the second resistor and the third resistor comprise a same type of resistor.

9. The circuit of claim 1 wherein noise associated with the mirror device is filtered by a same transfer function that filters the voltage input.

10. The circuit of claim 1 wherein the voltage input that is converted to the current output is substantially linear.

11. A system comprising:
a digital-to-analog converter (DAC) that is arranged and configured to receive a digital signal and convert the digital signal to an analog signal;
a configurable low pass filter that is arranged and configured to support multiple communications standards and that is arranged and configured to receive the analog signal, to filter the analog signal, and to output a baseband signal;
a first mixer and a second mixer that are arranged and configured to receive the baseband signal and to upconvert the baseband signal into a first radio frequency signal and a second radio frequency signal;
a summation module that is arranged and configured to receive the first radio frequency signal and the second radio frequency signal and to sum the first radio frequency signal and the second radio frequency signal into a third radio frequency signal; and
a power amplifier driver that is arranged and configured to receive the third radio frequency signal and to amplify the third radio frequency signal,
wherein the configurable low pass filter comprises:
a single transconductor having a constant-$g_m R$ biasing, wherein the constant-$g_m R$ biasing enables a transfer function of the single transconductor to be proportional to a time constant; and
a mirror device having noise from a mirror current, and the configurable low pass filter is arranged and configured to filter the noise of the mirror current.

12. The system of claim 11 wherein the configurable low pass filter is configured to support at least WCDMA and EDGE communication standards.

13. The system of claim 11 wherein the configurable low pass filter is a third order filter.

14. The system of claim 11 wherein the configurable low pass filter further comprises only a single transconductor.

15. The system of claim 14 wherein the single transconductor is a single operational amplifier (op-amp) that is arranged and configured to have a constant-$g_m R$ biasing.

16. The system of claim 11 wherein the configurable low pass filter further comprises:
at least two device capacitors and at least two resistors, wherein a filter transfer function may be scaled in a frequency domain by changing a ratio for the resistors.

17. The system of claim 11 wherein:
the mirror device comprises:
a first transistor having a gate operatively coupled to the single transconductor;
a second transistor having a source operatively coupled to a drain of the first transistor and a drain that is arranged and configured to provide a feedback loop as a feedback input to the single transconductor to filter the noise of the mirror current; and
a second resistor operatively coupled to the drain of the second transistor.

18. The system of claim 11 wherein:
the configurable low pass filter further comprises:
the single transconductor that is arranged and configured to receive a voltage input;
a first device capacitor that is operatively coupled to an output of the single transconductor;
a first resistor that is operatively coupled to the first device capacitor;
a second device capacitor that is operatively coupled to the first resistor; and
the mirror device is operatively coupled to the second device capacitor, wherein the mirror device is arranged and configured to provide a feedback loop as a feedback input to the single transconductor such that the configurable low pass filter provides a current output.

19. The system of claim 18 wherein the first device capacitor and the second device capacitor comprise metal oxide semiconductor (MOS) type transistors.

20. The system of claim 18 wherein the mirror device further comprises:
a first transistor having a gate operatively coupled to the second device capacitor;
a second transistor having a source operatively coupled to a drain of the first transistor and a drain that is arranged and configured to provide the feedback loop as the feedback input to the single transconductor; and
a second resistor operatively coupled to the drain of the second transistor.

* * * * *